(12) United States Patent
Petri et al.

(10) Patent No.: US 12,453,035 B2
(45) Date of Patent: Oct. 21, 2025

(54) CABLE ROUTING GUIDE

(71) Applicant: Device Technologies, Inc., Southborough, MA (US)

(72) Inventors: Nicholas B. Petri, Southborough, MA (US); Steven P. O'Loughlin, Southborough, MA (US)

(73) Assignee: Device Technologies, Inc., Southborough, MA (US)

( * ) Notice: Subject to any disclaimer, the term of this patent is extended or adjusted under 35 U.S.C. 154(b) by 95 days.

(21) Appl. No.: 18/139,080

(22) Filed: Apr. 25, 2023

(65) Prior Publication Data
US 2023/0354544 A1  Nov. 2, 2023

Related U.S. Application Data

(60) Provisional application No. 63/336,475, filed on Apr. 29, 2022.

(51) Int. Cl.
*H05K 7/14* (2006.01)

(52) U.S. Cl.
CPC .................... *H05K 7/1491* (2013.01)

(58) Field of Classification Search
CPC ... H05K 7/1491; G02B 6/4471; G02B 6/4478
See application file for complete search history.

(56) References Cited

U.S. PATENT DOCUMENTS

| | | | | |
|---|---|---|---|---|
| 6,546,179 | B2 * | 4/2003 | Petri | G02B 6/4457 385/134 |
| 6,586,680 | B1 * | 7/2003 | Nelson | G02B 6/4478 174/59 |
| 7,319,804 | B2 * | 1/2008 | Hruby | G02B 6/4478 385/136 |
| 8,315,069 | B2 * | 11/2012 | Caveney | H02G 3/0608 361/826 |
| 8,319,120 | B2 * | 11/2012 | Caveney | G02B 6/4459 174/101 |
| 9,784,938 | B2 * | 10/2017 | Kellerman | H02G 3/0443 |

* cited by examiner

*Primary Examiner* — Imani N Hayman
*Assistant Examiner* — Hung Q Dang
(74) *Attorney, Agent, or Firm* — Brian M. Dingman; Prince Lobel Tye LLP

(57) ABSTRACT

An optic cable guide securable to a housing panel and having a guide surface with a radius of curvature to restrict cable bends and projecting over a hole in the panel through which cables pass or alternatively securable to an inner surface of the panel for routing cables within the housing.

16 Claims, 6 Drawing Sheets

CABLE ROUTING GUIDE

CROSS-REFERENCE TO RELATED APPLICATION

This application claims priority of Provisional Application 63/336,475 filed on Apr. 29, 2022, the entire disclosure of which is incorporated by reference herein for all purposes.

BACKGROUND

This disclosure relates to a guide for holding a fiber-optic cable proximate an opening in a panel.

Fiber-optic cables are used to route electronic signals to and from servers. Cables can be damaged when run through openings in the sidewalls of the server. Guides can be used to route the cables. The guides should be constructed and arranged such that they hold the cable in a manner that does not bend the cable beyond its rated bend radius.

SUMMARY

Featured in this disclosure is a guide for placement at a hole through a panel and for supporting and limiting the bend radius of one or more fiber optic cables routed through the hole to a size greater than a minimum cable bend radius. The guide includes a curved ramp-shaped guide surface having a radius of curvature which is at least as great as the minimum cable bend radius, the guide surface having a width between two opposed edges, and cable-retaining walls extending from each of the opposed edges, the cable-retaining walls having a height. The height of the walls is greater than 30% of the width of the guide surface, to create a wide and deep cable-retention channel. There is also structure for affixing the guide to the panel.

In some examples the guide surface is partially cylindrical. In some examples the height of the walls is at least about 50% of the width of the guide surface. In some examples the height of the walls is up to about 200% of the width of the guide surface. In some examples the radius of curvature of the ramp is about 1.3 inches. In some examples the radius of curvature of the ramp is up to about 200% greater than 1.3 inches.

In some examples the guide further includes a wall projecting inwardly from the guide surface and arranged to engage one side of the panel adjacent to the hole, and the guide surface defines a slot intersecting the wall and providing access of a clip into engagement of the panel to the wall.

In some examples the guide surface comprises a lip portion extending past the wall and arranged to cover the edge. In some examples the wall projects radially from the guide surface. In some examples the guide is adapted for fixing to the panel such that the guide surface is substantially tangent at the panel to a line normal to the panel and passing through the hole. In some examples the clip is adapted for affixing to the panel by grasping an edge of a protrusion of the panel, the protrusion extending from and normal to the panel. In some examples the guide further includes at least one screw-hole through the guide and adapted to allow a screw to pass therethrough and into the panel to secure the guide to the panel.

In some examples the width of the guide surface is about 1.5 inches. In some examples the height of the walls is about 0.75 inches. In some examples the structure for affixing the guide to the panel is at least one screw-hole through the guide and adapted to allow a screw to pass therethrough and into the panel, to secure the guide to the panel. In some examples the guide further includes a hook and loop strap that is configured to passed through one or more openings in the guide, to hold the one or more fiber-optic cables on the guide surface between the cable-retaining walls.

In another aspect this disclosure features a guide for placement at a hole through a panel and for supporting and limiting the bend radius of one or more fiber optic cables routed through the hole to a size greater than a minimum cable bend radius, the guide including a curved ramp-shaped partially cylindrical guide surface having a radius of curvature of about 1.3 inches, the guide surface having a width of about 1.5 inches between two opposed edges, and cable-retaining walls extending from each of the opposed edges, the cable-retaining walls having a height of about 0.75 inches, to create a wide and deep cable-retention channel./ There is a wall projecting inwardly from the guide surface and arranged to engage one side of the panel adjacent to the hole, wherein the guide surface defines a slot intersecting the wall and providing access of a clip into engagement of the panel to the wall, wherein the guide surface comprises a lip portion extending past the wall and arranged to cover the edge, wherein the wall projects radially from the guide surface, wherein the guide is adapted for fixing to the panel such that the guide surface is substantially tangent at the panel to a line normal to the panel and passing through the hole, wherein the clip is adapted for affixing to the panel by grasping an edge of a protrusion of the panel, the protrusion extending from and normal to the panel. There is at least one screw-hole through the guide and adapted to allow a screw to pass therethrough and into the panel to secure the guide to the panel.

DETAILED DESCRIPTION

Figure 1:
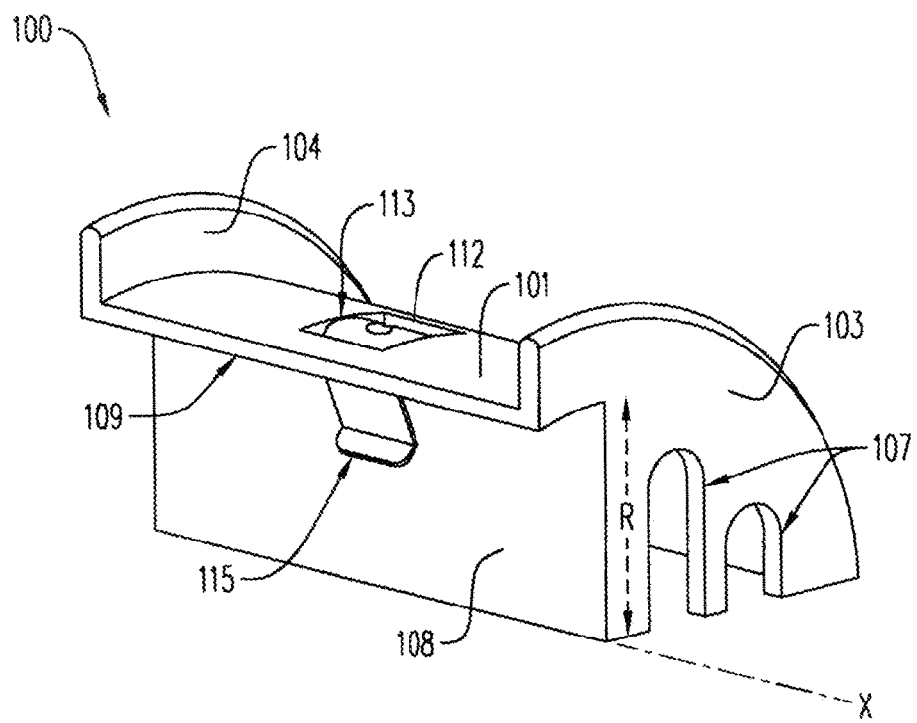
FIG. 1 is a perspective view of a cable routing guide according to an embodiment.
Figure 2:
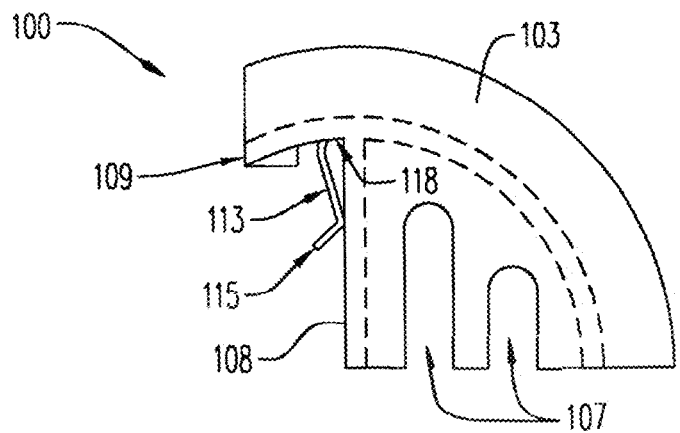
FIG. 2 is a side view of the guide of FIG. 1.
Figure 3:
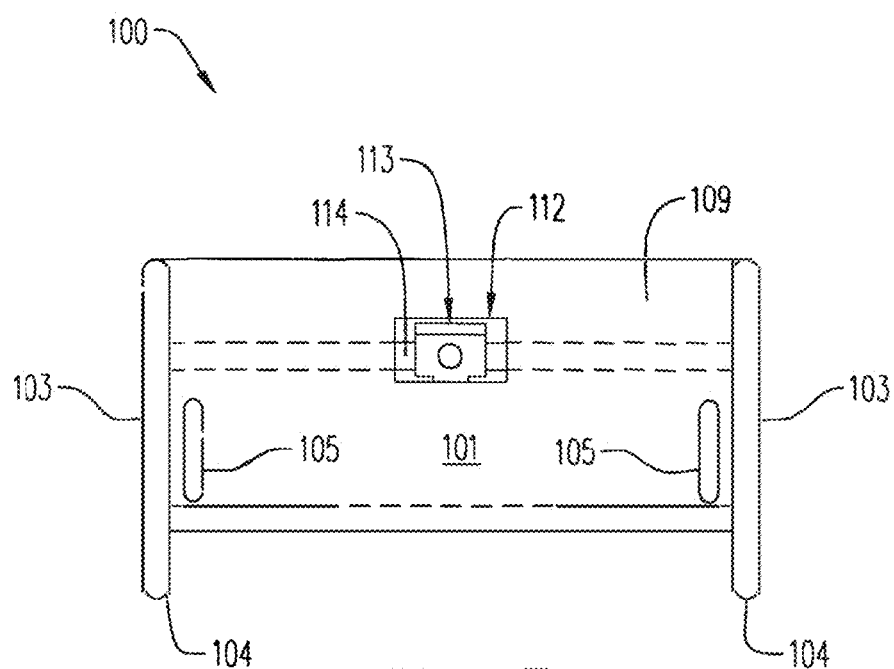
FIG. 3 is a top view of the guide of FIG. 1.
Figure 4:
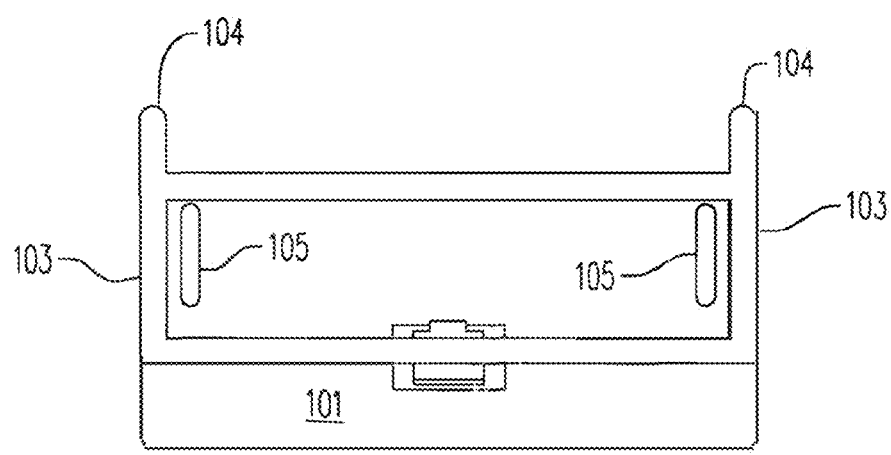
FIG. 4 is an end view of the guide of FIG. 1.

An exemplary optical fiber cable guide 100 of the present invention is depicted in FIGS. 1 through 7 and described herein. FIGS. 1-7 are from prior patent U.S. Pat. No. 6,546,179, the entire disclosure of which is incorporated herein by reference for all purposes. The guide is a singular component integrally molded of polycarbonate or an equivalent material.

Quarter-cylindrically curved guide surface 101 has a radius of curvature of one inch. This radius is sufficiently large to that fiber optic cables are not bent too sharply when supported there-around as in FIGS. 8 through 10. The quarter-cylinder of the guide surface is terminated at both ends by end walls 103, which extend inwardly towards the cylinder's imaginary axis and extend radially beyond the cylinder to provide arcuate flanges 104 that serve to retain the cable on the guide surface. Two slots 105 pass through the guide surface, each toward an opposite end thereof, through which a tie wrap or such (not shown) can be passed to secure cable against the guide surface.

The end walls include screw slots 107. Front wall 108 extends longitudinally and connects the cylinder axis to the guide surface. The cylindrical curve of the guide surface and the arcuate flanges of the end cap extend beyond the front wall to form a protective lip 109 that runs longitudinally for the length of the guide.

A slot 112 is molded through the cylindrical guide surface and is centrally positioned longitudinally and co-planar with the front wall. This slot is large enough to allow a clip 113, preferably made of steel, to pass therethrough and grasp the front wall at its upper edge 114.

The clip is a U-shaped spring with a lead-in tip 115 that causes the clip to spread as it is forced over the front wall edge so that the clip grasps the front wall firmly. The resiliency of the steel spring allows the clip to be spread a bit further apart without yielding, as required for the clip to grasp the edge of a panel hole as in FIG. 5 or a panel tab as in FIG. 6.

The guide is offered in several models, each identical except that the length of the guide surface in each has a different length to support a different number of cables and/or to accommodate sheet metal panel slots (punch outs) of various widths.

Figure 5:
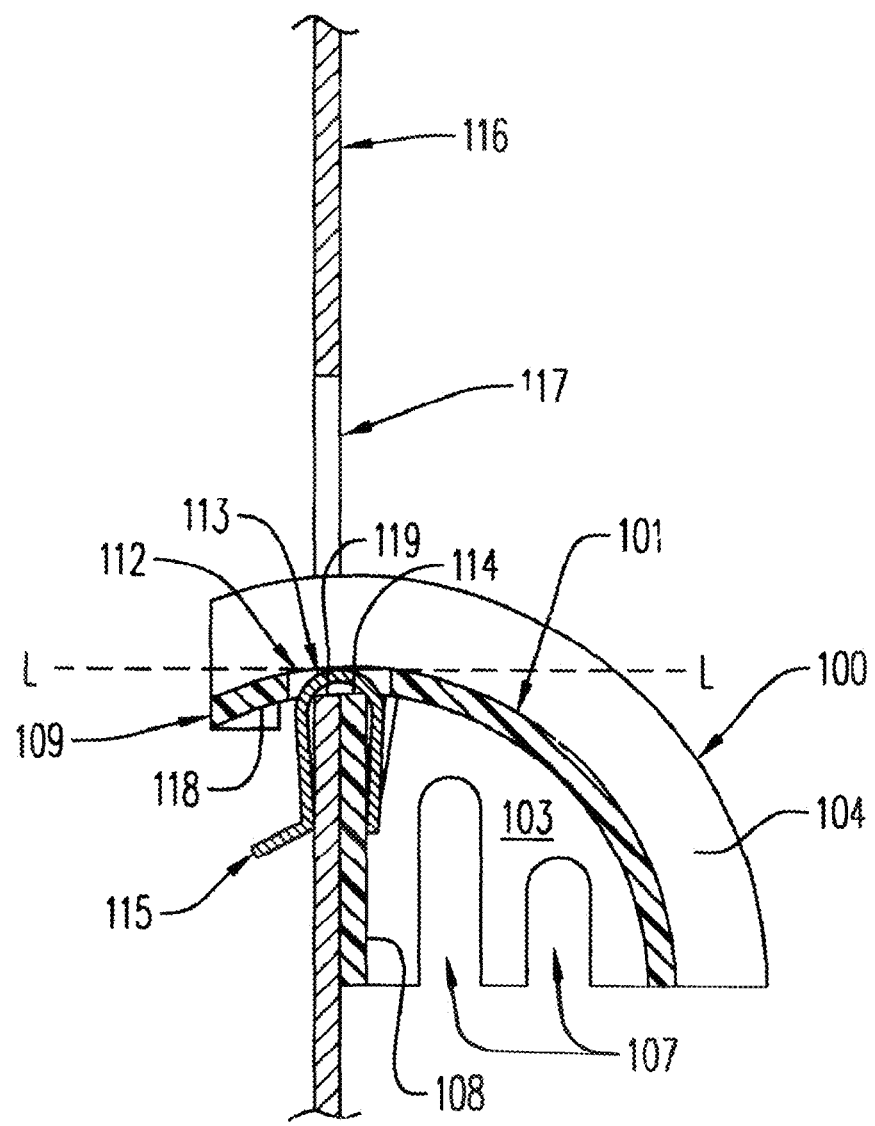
FIG. 5 is a cross-sectional side view of the guide of FIG. 1 shown affixed by means of the clip to a panel hole.

In FIG. 5, a sheet metal panel 116 is provided through which a rectangular hole 117 has been punched. The length and height of the hole are large enough to allow the guide's protective lip and the clip to pass therethrough. Then, the guide is lowered while the clip's lead-in engages the hole edge and causes the clip to spread over the edge. The guide is further lowered until the inside 118 of the guide's cylindrical surface rests on the lowermost edge 119 of the hole and the clip grasps that edge firmly to secure the guide to the panel. As shown, the radially directed wall 108 engages the panel 116 such that the guide surface 101 is tangent to a line L normal to the panel and the guide's axis of curvature X (FIG. 1) and radius of curvature lie in planes parallel to the panel. The spring characteristics of the clip are optimized for maximum holding force without yielding when the clip is spread to this condition.

FIG. 8 of the prior patent illustrates cables 121, having a specified minimum bend radius of less than one inch, routed from below the hole. They cannot be bent so sharply as they are routed into and through the hole as to damage them or their optical performance, because the curvature of the cylindrical guide surface defines the sharpest bend radius possible for the guide to be larger than the cable's minimum bend radius. Further, the protective lip of the guide extends over the sharp hole edge and protects the cable from being frayed or cut.

Figure 6:
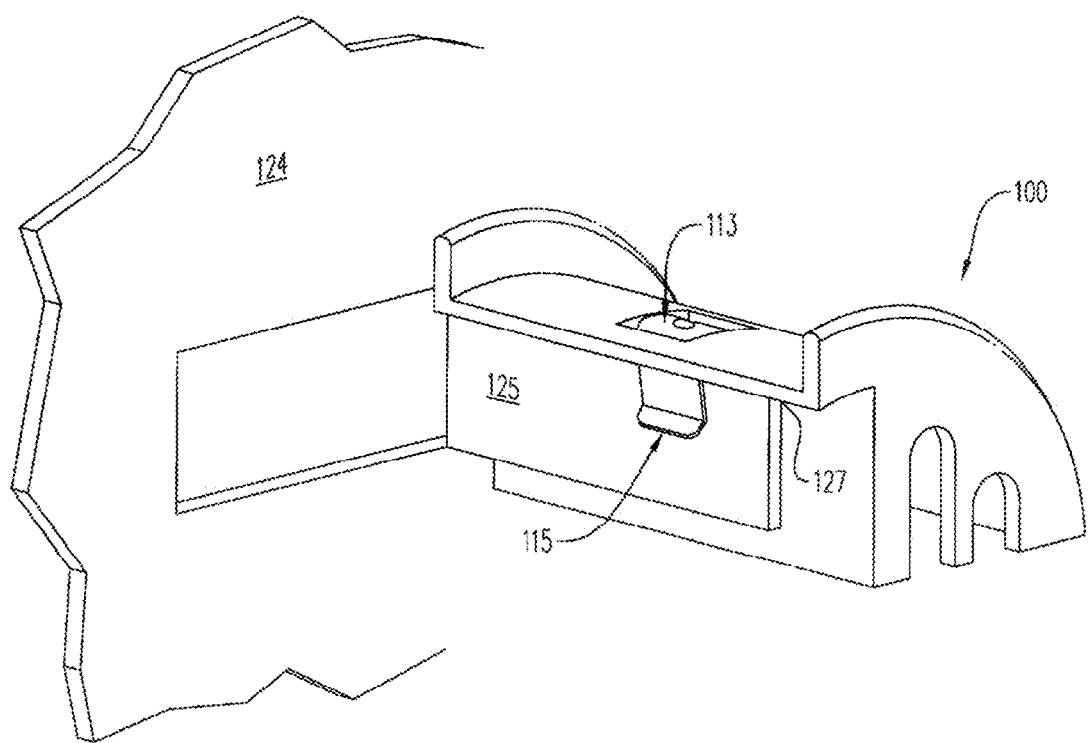
FIG. 6 is a perspective view of a guide of FIG. 1 shown affixed by means of the clip to a flange which protrudes from a panel.

In FIG. 6, a sheet metal panel 124 is provided from which tab 125 has been punched and bent so as to lie on a plane perpendicular to the surface of the panel. The clip is lowered over the upper edge. 127 of the tab and grasps the tab firmly. Cables can be routed from below the guide and passed over and supported by the guide in a way that ensures that they cannot be bent so sharply as to damage them or their optical performance for the same aforementioned reason.

Figure 7:
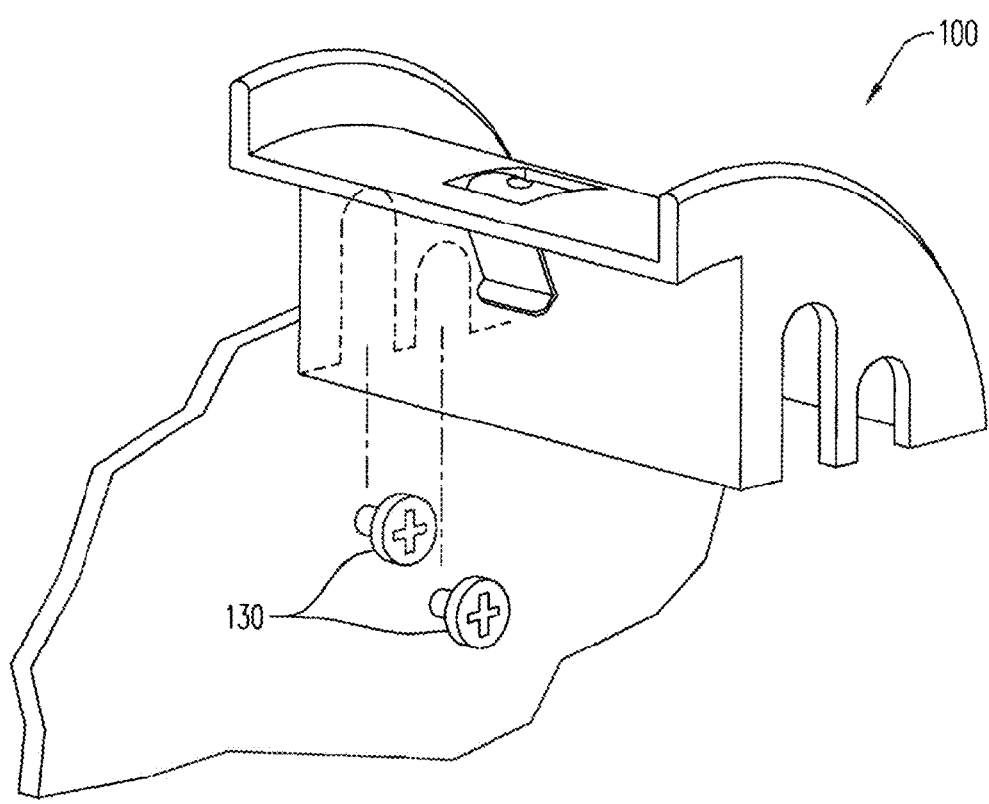
FIG. 7 is an exploded perspective view of the guide of FIG. 1 being attached to a panel by screws.

FIG. 7 depicts an alternate mode of attaching the guide to a panel by screws 130, when the punching and bending of a tab is not practical.

Figure 8A:
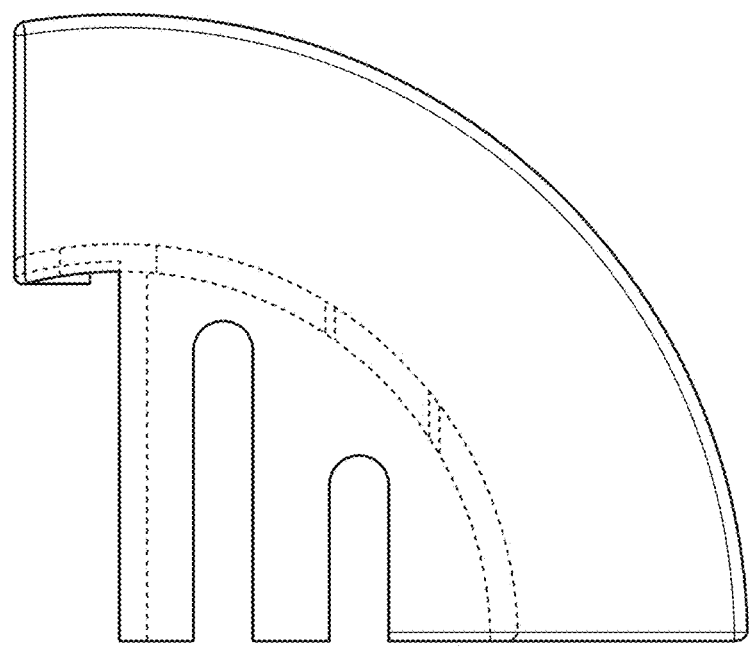
FIG. 8A is a side view and FIG. 8B is an end view of another cable routing guide.
Figure 8B:
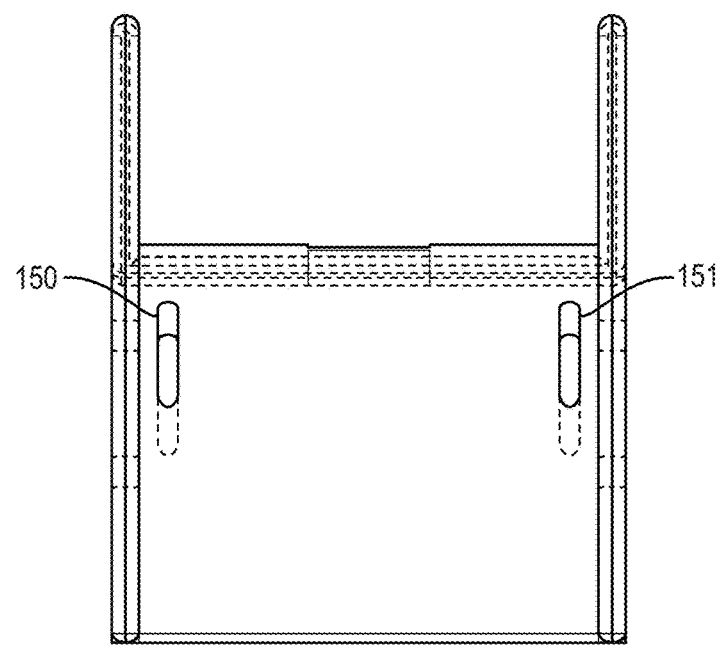

FIGS. 8A and 8B of the present patent application depict another example that is configured to hold larger cable bundles and cables having a larger minimum bend radius. This example is also a singular molded structure. In some examples the guide for placement at a hole through a panel and for supporting and limiting the bend radius of one or more fiber optic cables routed through the hole to a size greater than a minimum cable bend radius includes a curved ramp-shaped guide surface having a radius of curvature which is at least as great as the minimum cable bend radius. The guide surface has a width between two opposed edges. There are cable-retaining walls extending from each of the opposed edges, the cable-retaining walls having a height. In some examples the height of the walls is greater than 30% of the width of the guide surface, to create a wide and deep cable-retention channel. The wide and deep channel is better able to retain more fiber bundles and bundles with more fibers. The guide includes structure for affixing the guide to a panel, such as the structures described above and shown in the drawings.

In certain examples the guide surface is partially cylindrical. In an example the height of the walls is about 50% of the width of the guide surface. In some examples the height of the walls is up to about 100% of the width of the guide surface. In some examples the radius of curvature of the ramp is about 1.3 inches.

In one specific non-limiting example, the ramp is 1.5 inches wide and has a radius of curvature of 1.3 inches. The walls are 0.75 inches high. Slots 107 are 0.444 inches apart. One slot is 0.339 inches from wall 108. One slot is 0.511 inches long and the other is 0.955 inches long. The ramp overhangs wall 108 by 0.340 inches. Opening 112 is 0.395 inches wide.

A hook and loop strap (not shown) can be routed through one or more openings of the guide (e.g., slots 150 and 151 or slots 107) and wrapped around the cable(s) that are held in the guide.

This affirmatively holds the cables on the ramp surface between the sidewalls and so retains the cables on the guide.

Examples of the systems, methods and apparatuses discussed herein are not limited in application to the details of construction and the arrangement of components set forth in the following description or illustrated in the accompanying drawings. The systems, methods and apparatuses are capable of implementation in other examples and of being practiced or of being carried out in various ways. Examples of specific implementations are provided herein for illustrative purposes only and are not intended to be limiting. In particular, functions, components, elements, and features discussed in connection with any one or more examples are not intended to be excluded from a similar role in any other examples.

Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

Also, the phraseology and terminology used herein is for the purpose of description and should not be regarded as limiting. Any references to examples, components, elements, acts, or functions of the computer program products, systems and methods herein referred to in the singular may also embrace embodiments including a plurality, and any references in plural to any example, component, element, act, or function herein may also embrace examples including only a singularity. Accordingly, references in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A guide for placement at a hole through a panel and for supporting and limiting the bend radius of one or more fiber optic cables routed through the hole to a size greater than a minimum recommended cable bend radius, comprising:
    a curved ramp-shaped guide surface having a radius of curvature of more than one inch, which is at least as great as the minimum recommended cable bend radius, the guide surface having a width of more than one inch between two opposed edges;
    two opposed cable-retaining walls, one wall extending from each of the opposed edges, both of the cable-retaining walls having a height above the guide surface, to define arcuate flanges that extend along both edges of the entire guide surface;
    wherein the height of the walls is at least 50% of the width of the guide surface, to create a wide and deep cable-retention channel that has a contained area of at least 0.5 square inches between the guide surface and the cable-retaining walls; and
    structure for affixing the guide to the panel.

2. The guide of claim 1, wherein the guide surface is partially cylindrical.

3. The guide of claim 1, wherein the height of the walls is up to 200% of the width of the guide surface.

4. The guide of claim 1, wherein the radius of curvature of the ramp is 1.3 inches.

5. The guide of claim 4, wherein the radius of curvature of the ramp is up to 200% greater than 1.3 inches.

6. The guide of claim 1, further comprising a wall projecting inwardly from the guide surface and arranged to engage one side of the panel adjacent to the hole, and the guide surface defines a slot intersecting the wall and providing access of a clip into engagement of the panel to the wall.

7. The guide of claim 6, wherein the guide surface comprises a lip portion extending past the wall and arranged to cover the edge.

8. The guide of claim 7, wherein the wall projects radially from the guide surface.

9. The guide of claim 8, wherein the guide is adapted for fixing to the panel such that the guide surface is substantially tangent at the panel to a line normal to the panel and passing through the hole.

10. The guide of claim 9, wherein the clip is adapted for affixing to the panel by grasping an edge of a protrusion of the panel, the protrusion extending from and normal to the panel.

11. The guide of claim 10, further comprising at least one screw-hole through the guide and adapted to allow a screw to pass therethrough and into the panel to secure the guide to the panel.

12. The guide of claim 1, wherein the width of the guide surface is 1.5 inches.

13. The guide of claim 12, wherein the height of the walls is 0.75 inches.

14. The guide of claim 1, wherein the structure for affixing the guide to the panel is at least one screw-hole through the guide and adapted to allow a screw to pass therethrough and into the panel, to secure the guide to the panel.

15. The guide of claim 1, further comprising one or more openings in the guide that are configured to accept a hook and loop strap, to hold the one or more fiber-optic cables on the guide surface between the cable-retaining walls.

16. A guide for placement at a hole through a panel and for supporting and limiting the bend radius of one or more fiber optic cables routed through the hole to a size greater than a minimum recommended cable bend radius, comprising:
    a curved ramp-shaped quarter cylindrical guide surface having a radius of curvature of 1.3 inches, the guide surface having a width of 1.5 inches between two opposed edges;
    two opposed cable-retaining walls, one wall extending from each of the opposed edges, both of the cable-retaining walls having a height of 0.75 inches above the guide surface, to define arcuate flanges that extend along both edges of the entire guide surface and thus to create a wide and deep cable-retention channel that has a contained area of at least 1.125 square inches between the guide surface and the cable-retaining walls and a contained volume of 2.3 cubic inches between the guide surface and the cable-retaining walls along the entire length of the guide surface;
    a wall projecting inwardly from the guide surface and arranged to engage one side of the panel adjacent to the hole, wherein the guide surface defines a slot intersecting the wall and providing access of a clip into engagement of the panel to the wall, wherein the guide surface comprises a lip portion extending past the wall and arranged to cover the edge, wherein the wall projects radially from the guide surface, wherein the guide is adapted for fixing to the panel such that the guide surface is substantially tangent at the panel to a line normal to the panel and passing through the hole, wherein the clip is adapted for affixing to the panel by grasping an edge of a protrusion of the panel, the protrusion extending from and normal to the panel; and
    at least one screw-hole through the guide and adapted to allow a screw to pass therethrough and into the panel to secure the guide to the panel.

* * * * *